US009972741B2

(12) United States Patent
Beck et al.

(10) Patent No.: US 9,972,741 B2
(45) Date of Patent: *May 15, 2018

(54) METHODS OF FORMING THIN-FILM PHOTOVOLTAIC DEVICES WITH DISCONTINUOUS PASSIVATION LAYERS

(71) Applicants: Markus Eberhard Beck, Scotts Valley, CA (US); Timothy J. Nagle, Campbell, CA (US); Sourav Roger Basu, San Francisco, CA (US)

(72) Inventors: Markus Eberhard Beck, Scotts Valley, CA (US); Timothy J. Nagle, Campbell, CA (US); Sourav Roger Basu, San Francisco, CA (US)

(73) Assignee: SIVA POWER, INC., San Jose, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/656,029

(22) Filed: Jul. 21, 2017

(65) Prior Publication Data

US 2017/0323997 A1    Nov. 9, 2017

Related U.S. Application Data

(63) Continuation of application No. 15/151,629, filed on May 11, 2016, now Pat. No. 9,748,435, which is a
(Continued)

(51) Int. Cl.
*H01L 31/18* (2006.01)
*H01L 31/0749* (2012.01)
(Continued)

(52) U.S. Cl.
CPC .... *H01L 31/1868* (2013.01); *H01L 31/02008* (2013.01); *H01L 31/02167* (2013.01);
(Continued)

(58) Field of Classification Search
CPC ............. H01L 31/1868; H01L 31/1884; H01L 31/0749; H01L 31/68; H01L 31/02008;
(Continued)

(56) References Cited

U.S. PATENT DOCUMENTS 3,988,167 A    10/1976   Kressel et al.
4,818,337 A     4/1989   Barnett et al.
(Continued)

FOREIGN PATENT DOCUMENTS

WO    WO-2011160246 A1    12/2011
WO    WO-2012067625        5/2012

OTHER PUBLICATIONS

PCT International Patent Application No. PCT/US2014/056771, International Search Report and Written Opinion dated Jan. 22, 2015, 8 pages.
(Continued)

*Primary Examiner* — Michael Trinh
(74) *Attorney, Agent, or Firm* — Morgan, Lewis & Bockius LLP

(57) ABSTRACT

In various embodiments, photovoltaic devices incorporate discontinuous passivation layers (i) disposed between a thin-film absorber layer and a partner layer, (ii) disposed between the partner layer and a front contact layer, and/or (iii) disposed between a back contact layer and the thin-film absorber layer.

40 Claims, 12 Drawing Sheets

Related U.S. Application Data continuation of application No. 14/869,224, filed on Sep. 29, 2015, now Pat. No. 9,362,423, which is a continuation of application No. 14/492,693, filed on Sep. 22, 2014, now Pat. No. 9,178,082.

(60) Provisional application No. 61/881,095, filed on Sep. 23, 2013.

(51) Int. Cl.

| | | |
|---|---|---|
| *H01L 31/0224* | (2006.01) | |
| *H01L 31/056* | (2014.01) | |
| *H01L 31/068* | (2012.01) | |
| *H01L 31/0232* | (2014.01) | |
| *H01L 31/02* | (2006.01) | |
| *H01L 31/0216* | (2014.01) | |
| *H01L 31/032* | (2006.01) | |

(52) U.S. Cl.
CPC .......... *H01L 31/02327* (2013.01); *H01L 31/022425* (2013.01); *H01L 31/022441* (2013.01); *H01L 31/0322* (2013.01); *H01L 31/056* (2014.12); *H01L 31/068* (2013.01); *H01L 31/0749* (2013.01); *H01L 31/1884* (2013.01); *Y02E 10/52* (2013.01); *Y02E 10/541* (2013.01)

(58) Field of Classification Search
CPC .......... H01L 31/02167; H01L 31/0216; H01L 31/022425; H01L 31/022441; H01L 31/02327; H01L 31/0322; H01L 31/056
See application file for complete search history.

(56) References Cited

U.S. PATENT DOCUMENTS

| | | | |
|---|---|---|---|
| 5,221,854 | A | 6/1993 | Banerjee et al. |
| 5,356,488 | A | 10/1994 | Hezel |
| 7,253,017 | B1 | 8/2007 | Roscheisen et al. |
| 7,897,020 | B2 * | 3/2011 | Mackie ................. C23C 14/165 136/243 |
| 8,143,512 | B2 | 3/2012 | Paulson et al. |
| 8,212,143 | B2 | 7/2012 | Tsai et al. |
| 8,283,559 | B2 | 10/2012 | Yu et al. |
| 8,410,357 | B2 | 4/2013 | Paulson et al. |
| 8,860,005 | B1 * | 10/2014 | Bedell .................... H01L 33/10 257/13 |
| 9,178,082 | B2 | 11/2015 | Beck |
| 9,362,423 | B2 * | 6/2016 | Beck ................ H01L 31/02008 |
| 2006/0157733 | A1 | 7/2006 | Lucovsky et al. |
| 2007/0169808 | A1 | 7/2007 | Kherani et al. |
| 2008/0185574 | A1 | 8/2008 | Campbell et al. |
| 2008/0251121 | A1 | 10/2008 | Stone |
| 2009/0038669 | A1 | 2/2009 | Atanackovic |
| 2009/0283139 | A1 | 11/2009 | Chen et al. |
| 2010/0037937 | A1 * | 2/2010 | Sater ............... H01L 31/022425 136/249 |
| 2010/0055822 | A1 | 3/2010 | Weidman |
| 2010/0164073 | A1 | 7/2010 | Lewis et al. |
| 2011/0005582 | A1 | 1/2011 | Szlufcik et al. |
| 2011/0088764 | A1 | 4/2011 | Tsai |
| 2011/0284068 | A1 | 11/2011 | Moslehi et al. |
| 2011/0312120 | A1 | 12/2011 | Weiner |
| 2013/0019940 | A1 * | 1/2013 | Krasnov ......... H01L 31/022425 136/256 |
| 2013/0074925 | A1 | 3/2013 | Hakuma et al. |
| 2013/0133737 | A1 | 5/2013 | Umeda |
| 2013/0152999 | A1 * | 6/2013 | Lincot ............ H01L 31/022425 136/246 |
| 2013/0153015 | A1 | 6/2013 | Lee et al. |
| 2013/0171767 | A1 | 7/2013 | Moslehi et al. |
| 2013/0186460 | A1 | 7/2013 | Chen et al. |
| 2014/0045295 | A1 | 2/2014 | Ahmed et al. |
| 2014/0060627 | A1 | 3/2014 | Haensch |
| 2014/0080250 | A1 | 3/2014 | Liang |

OTHER PUBLICATIONS

B. Vermang, et al., Introduction of Si PERC Rear Contacting Design to Boost Efficiency of Cu(In,Ga)Se2 Solar Cells, IEEE Journal of Photovoltaics, vol. 4, No. 6, pp. 1644-1649, Nov. 2014.

B. Vermang, et al., Improved Rear Surface Passivation of Cu(In,Ga)Se2 Solar Cells: A Combination of an Al2O3 Rear Surface Passivation Layer and Nanosized Local Rear Point Contacts, IEEE Journal of Photovoltaics, vol. 4, No. 1, pp. 486-492, Jan. 2014.

B. Vermang, et al., Employing Si solar cell technology to increase efficiency of ultra-thin Cu(In,Ga)Se2 solar cells, Progress in Photovoltaics: Research and Applications, vol. 22, Issue 10, pp. 1023-1029, Oct. 2014.

B. Vermang, et al., Development of rear surface passivated Cu(In,Ga)Se2 thin film solar cells with nano-sized local rear point contacts, Solar Energy Materials & Solar Cells, vol. 117, pp. 505-511, Oct. 2013.

* cited by examiner

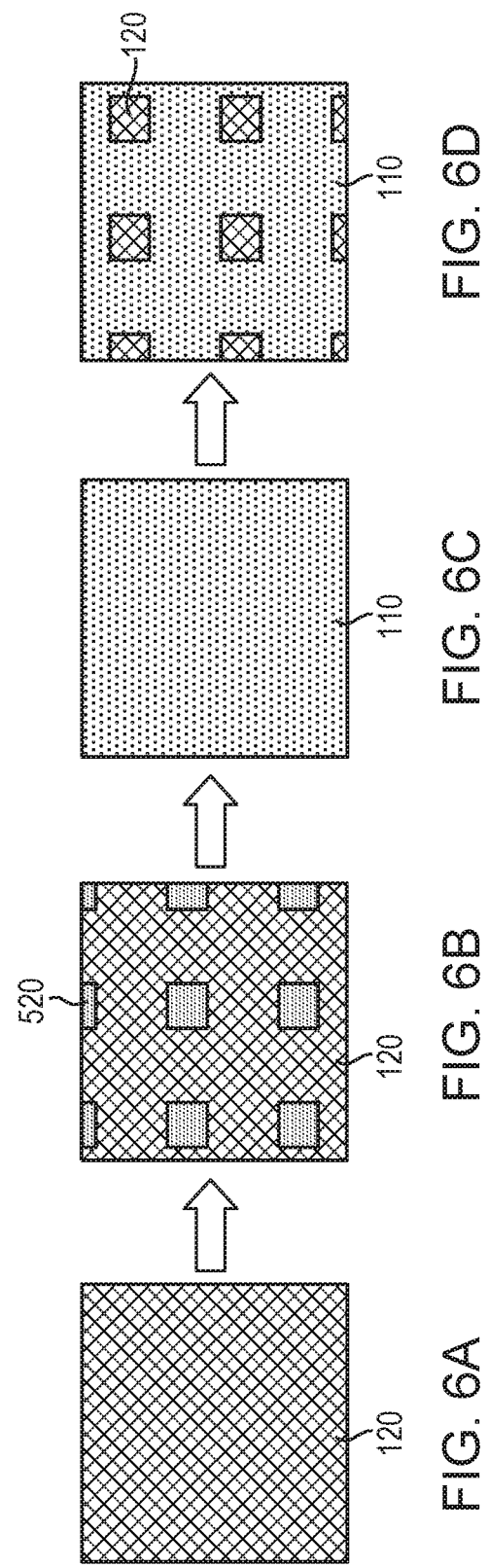

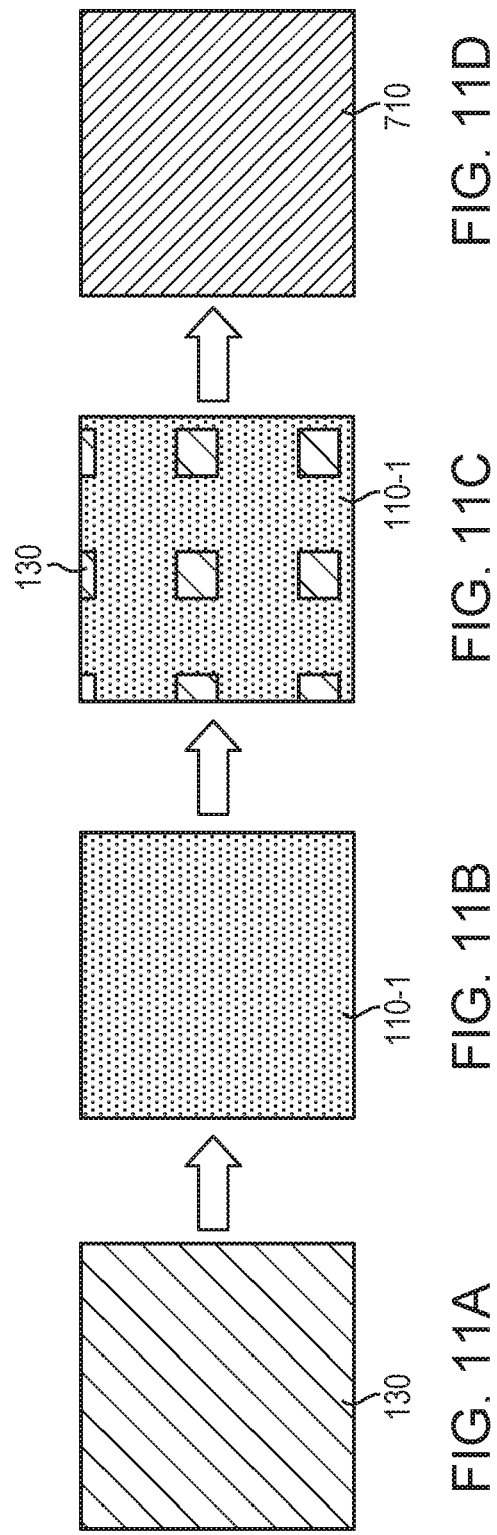

METHODS OF FORMING THIN-FILM PHOTOVOLTAIC DEVICES WITH DISCONTINUOUS PASSIVATION LAYERS

RELATED APPLICATION

This application is a continuation of U.S. patent application Ser. No. 15/151,629, filed May 11, 2016, which is a continuation of U.S. patent application Ser. No. 14/869,224, filed Sep. 29, 2015, which is a continuation of U.S. patent application Ser. No. 14/492,693, filed Sep. 22, 2014, which claims the benefit of and priority to U.S. Provisional Patent Application No. 61/881,095, filed Sep. 23, 2013, the entire disclosure of each of which is hereby incorporated herein by reference.

TECHNICAL FIELD

In various embodiments, the present invention relates to thin-film photovoltaics, in particular to passivated thin-film photovoltaic modules.

BACKGROUND

The use of thin-film photovoltaic (PV) devices based on amorphous Si (a-Si), cadmium telluride (CdTe), or copper indium gallium selenide ($CuIn_xGa_{1-x}Se_2$ or CIGS) is becoming more widespread due to continued enhancements in cell efficiency, which are coupled with decreasing costs. However, as in crystalline-silicon PV devices, charge-carrier recombination at interfaces within the cell or at exposed surfaces of the cell can reduce cell efficiency via charge carrier losses. Reducing charge-carrier recombination, therefore, can beneficially increase the open circuit voltage, short circuit current, and efficiency of thin-film PV devices. While carrier recombination may be reduced at exposed surfaces of PV devices through the use of passivating insulating layers (e.g., thermally grown silicon dioxide layers on Si PV devices), such insulating layers block current flow and thus may not be utilized within the PV cell itself, or carrier transport within the PV cell will be disrupted or blocked. Thus, there is a need for carrier-recombination techniques usable within the cell structures of PV devices (e.g., at interfaces within the cell) that do not deleteriously impact device efficiency.

SUMMARY

Embodiments of the present invention incorporate discontinuous passivation layers within thin-film PV devices to reduce carrier recombination. The passivation layers are discontinuous in the sense that they define openings therethrough or that they consist essentially of a collection of "particles," i.e., localized portions each discrete from the others (and, thereby, once again, forming openings). For example, a substantially uniform passivation layer may be formed within the PV device and patterned to open holes therethrough or to separate the passivation layer into multiple discrete portions (e.g., stripes). Alternatively, discrete particles of the passivating material may be formed directly within the device via, e.g., chemical bath deposition.

The passivation layers may be utilized to reduce or substantially eliminate electrically active surface and/or interface states within the PV device, and may thus be located (1) between the absorber layer and the back contact, (2) between the absorber layer and the "partner layer" forming the electrical junction with the absorber layer, (3) between the partner layer and the front contact layer, and/or (4) between other layers within the cell (for example, between CdTe and a material with a conduction band offset (e.g., ZnTe) utilized as an electron reflector, or even adjacent to internal lateral conducting layer in a multijunction cell). The layers are discontinuous in order to enable sufficient electrical contact between the layers at the interface being passivated. That is, continuous (e.g., unpatterned) passivation layers are generally not utilized in accordance with embodiments of the present invention, as they tend to result in deleterious increases in series resistance within the PV device.

Each passivation layer preferably includes or consists essentially of a dielectric material. Exemplary materials include ZnS and high-dielectric-constant (i.e., "high-k") dielectrics such as high-k oxides. Particularly preferred examples include CaO, MgO, $CaF_2$, and LiF. The passivation layers also preferably meet the following criteria. First, the passivating material preferably has a high dielectric constant greater than or approximately equal to 3.9, for example, greater than 10. Further, the passivation layer is generally chemically, thermally, and mechanically compatible with the subsequent processing steps utilized to form and complete the PV device. The layers also are thermally robust, are substantially free of interdiffusion with adjoining layers after processing, and withstand high-temperature ambients while maintaining dielectric properties. The passivation layers are also formed with sufficiently low levels of film and interface stress such that they exhibit excellent adhesion to adjoining layers without delamination. The layers are generally thermodynamically stable and thus do not react substantially with underlying material during their formation and processing.

The passivation layers preferably have fairly large band gaps (e.g., greater than 3 eV, greater than 5 eV, greater than 10 eV, and/or less than 15 eV) and band offsets to the conduction and valence band of adjoining layers (e.g., the absorber layer, partner layer, front contact layer, and/or back contact layer) of greater than 1 eV (and may be less than approximately 7.5 eV). The band offsets are preferably arranged in the "type-I" or "straddling" arrangement such that the valence band of the passivation layer is lower in energy than the valence band of adjacent layers and the conduction band of the passivation layer is higher than the conduction band of adjacent layers. In some embodiments, the passivation layers include or consist essentially of an amorphous material, and the material remains amorphous during and after subsequent high-temperature processing. The passivation layers are also preferably easy to pattern without damage to underlying layers. For example, the passivation layers may have high solubilities in selective etchants that do not damage other layers of the PV device structure, and/or the layers may exhibit high optical absorption of laser radiation that may be utilized to remove portions of the layers via, e.g., laser ablation or laser drilling. In some embodiments, the passivation layers do not themselves absorb large amounts of laser radiation; rather, all or substantially all of the light passes through the passivation layer and is absorbed into an underlying layer, leading to selective detachment of the portion of the passivation layer thereover (i.e., a laser "lift-off" process).

The thicknesses of the passivation layers may be, e.g., at least approximately 2 nm, at least approximately 5 nm, at least approximately 10 nm, at least approximately 20 nm, at least approximately 40 nm, at least approximately 50 nm, or even at least approximately 100 nm. In some embodiments, the thickness of the passivation layers is no greater than 100 nm. The layers may be deposited by, e.g., physical vapor deposition methods such as e-beam evaporation, thermal evaporation, or sputtering, or by chemical vapor deposition (CVD) methods such as metallorganic CVD, plasma-enhanced CVD, or atomic layer deposition. The deposited layers may be patterned via conventional photolithography and etch techniques to form, for example, a substantially periodic pattern of openings. In other embodiments, the openings form a substantially random or semi-random pattern. The passivation layers may be patterned via selective removal by laser ablation. The size and spacing of the openings may vary at length scales of, e.g., less than 10 nm to tens or hundreds of microns or more with material of higher electrical quality (e.g., long carrier lifetime, long carrier diffusion length) enabling the use of smaller openings and larger pitch between openings. Similarly, the shape of the contact pattern may be square, rectangular, circular, triangular, or of any suitable shape or polygon. Alternatively, the discontinuous passivation layers may be deposited in discontinuous form, thus obviating the need for patterning. For example, localized particles of the passivating material may be deposited onto one or more of the layers of the PV device structure. The size and spacing of the particles may vary at length scales of, e.g., tens or hundreds of nanometers up to tens of microns or more with material of higher electrical quality (e.g., long carrier lifetime, long carrier diffusion length) enabling the use of larger particles and smaller pitch between particles. In other embodiments, a mask may be utilized to shadow portions of the PV device structure during deposition of the passivating material, resulting in a discontinuous passivation layer deposited only over regions where the mask is not present. The size and spacing of the shadowed features may vary at length scales of, e.g., less than 10 nm to tens or hundreds of microns or more with material of higher electrical quality (e.g., long carrier lifetime, long carrier diffusion length) enabling the use of smaller openings and larger pitch between openings.

In an aspect, embodiments of the invention feature a photovoltaic device that includes or consists essentially of a back contact layer, a thin-film absorber layer, a partner layer, a front contact layer, and first, second, and/or third discontinuous passivation layers. The back contact layer includes or consists essentially of a conductive material (e.g., a metal such as Mo). The thin-film absorber layer is disposed over and in electrical contact with the back contact layer. The thin-film absorber layer has a doping polarity (i.e., n-type or p-type). The partner layer is disposed over and in electrical contact with the thin-film absorber layer. The partner layer has a doping polarity opposite that of the thin-film absorber layer, the partner layer and thin-film absorber layer thereby forming a p-n junction. The front contact layer is disposed over and in electrical contact with the partner layer. The first discontinuous passivation layer, if present, is disposed between the thin-film absorber layer and the partner layer, the partner layer making electrical contact with the thin-film absorber layer only through discontinuities in the first discontinuous passivation layer. The second discontinuous passivation layer, if present, is disposed between the partner layer and the front contact layer, the front contact layer making electrical contact with the partner layer only through discontinuities in the second discontinuous passivation layer. The third discontinuous passivation layer, if present, is disposed between the back contact layer and the thin-film absorber layer, the thin-film absorber layer making electrical contact with the back contact layer only through discontinuities in the third discontinuous passivation layer (and discontinuities in a discontinuous back reflector layer and/or a sodium-containing layer, if present).

Embodiments of the invention may include one or more of the following in any of a variety of different combinations. The front contact layer may include or consist essentially of a transparent conductive oxide (e.g., indium tin oxide). The back contact layer may include or consist essentially of molybdenum. The back contact layer may include or consist essentially of a sodium-containing conductive material (e.g., Mo:NaF and/or Mo:Na$_2$MoO$_4$). The absorber layer may include or consist essentially of amorphous silicon. CdTe, chalcopyrite (Cu(In,Ga)(S,Se)$_2$), and/or kesterite (Cu$_2$(Zn,Fe)Sn(S,Se)$_4$). The first, second, and/or third discontinuous passivation layers may include or consist essentially of an insulator having a dielectric constant greater than or approximately equal to 3.9. The first, second, and/or third discontinuous passivation layers may include or consist essentially of an insulator having a dielectric constant greater than or approximately equal to 10. The first, second, and/or third discontinuous passivation layers may have a band gap exceeding 3 eV. The first, second, and/or third discontinuous passivation layers may have a band offset to an adjoining layer exceeding 1 eV. The band offset may be a type-I band offset. The first, second, and/or third discontinuous passivation layers may include or consist essentially of CaO, MgO, and/or ZnS. The device may include a sodium-containing layer disposed between the back contact layer and the thin-film absorber layer. The sodium-containing layer may be continuous or discontinuous. Discontinuities in a discontinuous sodium-containing layer may overlap partially or substantially entirely (i.e., be substantially aligned) with discontinuities in a discontinuous passivation layer and/or a discontinuous reflector layer. Alternatively, the discrete regions of a discontinuous sodium-containing layer may partially or substantially entirely overlap the discontinuities in a discontinuous passivation layer and/or a discontinuous reflector layer. The sodium-containing layer may include or consist essentially of NaF and/or Na$_2$Se. The device may include a discontinuous reflector layer disposed between the back contact layer and the thin-film absorber layer. The discontinuous reflector layer may reflect solar energy passing through the absorber layer back toward the absorber layer. The discontinuous reflector layer may include or consist essentially of aluminum, silver, titanium dioxide, and/or zirconium nitride.

In another aspect, embodiments of the invention feature a method for forming a photovoltaic device. A thin-film absorber layer is formed over and in electrical contact with a back contact layer. The thin-film absorber layer has a doping polarity. The back contact layer includes or consists essentially of a conductive material. A partner layer is formed over and in electrical contact with the thin-film absorber layer. The partner layer has a doping polarity opposite that of the thin-film absorber layer, the partner layer and thin-film absorber layer thereby forming a p-n junction. A front contact layer disposed over and in electrical contact with the partner layer is formed. A first discontinuous passivation layer, a second discontinuous passivation layer, and/or a third discontinuous passivation layer is formed. The first discontinuous passivation layer, if formed, is disposed between the thin-film absorber layer and the partner layer, the partner layer making electrical contact with the thin-film absorber layer only through discontinuities in the first discontinuous passivation layer. The second discontinuous passivation layer, if formed, is disposed between the partner layer and the front contact layer, the front contact layer making electrical contact with the partner layer only through discontinuities in the second discontinuous passivation layer. The third discontinuous passivation layer, if formed, is disposed between the back contact layer and the thin-film absorber layer, the thin-film absorber layer making electrical contact with the back contact layer only through discontinuities in the third discontinuous passivation layer (and discontinuities in a discontinuous back reflector layer and/or a sodium-containing layer, if present).

Embodiments of the invention may include one or more of the following in any of a variety of different combinations. The first discontinuous passivation layer may be formed by a process including or consisting essentially of forming a passivation layer over the thin-film absorber layer, and patterning the passivation layer to form the first discontinuous passivation layer and reveal portions of the thin-film absorber layer through discontinuities in the first discontinuous passivation layer. The partner layer may make electrical contact with the thin-film absorber layer through the discontinuities in the first discontinuous passivation layer. The first discontinuous passivation layer may be formed by a process including or consisting essentially of depositing discrete particles of a passivating material over the thin-film absorber layer, regions between the discrete particles being the discontinuities in the first discontinuous passivation layer. The first discontinuous passivation layer may be formed by a process including or consisting essentially of disposing a mask over the thin-film absorber layer, only portions of the thin-film absorber layer being revealed through openings in the mask, and depositing a passivating material over the mask to form discrete portions of the passivating material through the openings in the mask, regions between the discrete portions being the discontinuities in the first discontinuous passivation layer.

The second discontinuous passivation layer may be formed by a process including or consisting essentially of forming a passivation layer over the partner layer, and patterning the passivation layer to form the second discontinuous passivation layer and reveal portions of the partner layer through discontinuities in the second discontinuous passivation layer. The front contact layer may make electrical contact with the partner layer through the discontinuities in the second discontinuous passivation layer. The second discontinuous passivation layer may be formed by a process including or consisting essentially of depositing discrete particles of a passivating material over the partner layer, regions between the discrete particles being the discontinuities in the second discontinuous passivation layer. The second discontinuous passivation layer may be formed by a process including or consisting essentially of disposing a mask over the partner layer, only portions of the partner layer being revealed through openings in the mask, and depositing a passivating material over the mask to form discrete portions of the passivating material through the openings in the mask, regions between the discrete portions being the discontinuities in the second discontinuous passivation layer.

The third discontinuous passivation layer may be formed by a process including or consisting essentially of forming a passivation layer over the back contact layer, and patterning the passivation layer to form the third discontinuous passivation layer and reveal portions of the back contact layer through discontinuities in the third discontinuous passivation layer. The thin-film absorber layer may make electrical contact with the back contact layer through discontinuities in the third discontinuous passivation layer. The third discontinuous passivation layer may be formed by a process including or consisting essentially of depositing discrete particles of a passivating material over the back contact layer, regions between the discrete particles being the discontinuities in the third discontinuous passivation layer. The third discontinuous passivation layer may be formed by a process including or consisting essentially of disposing a mask over the back contact layer, only portions of the back contact layer being revealed through openings in the mask, and depositing a passivating material over the mask to form discrete portions of the passivating material through the openings in the mask, regions between the discrete portions being the discontinuities in the third discontinuous passivation layer.

A sodium-containing layer may be formed over the back contact layer prior to forming the thin-film absorber layer. The sodium-containing layer may include or consist essentially of NaF and/or $Na_2Se$. A discontinuous back reflector may be formed over the back contact layer prior to forming the thin-film absorber layer. The discontinuous reflector layer may reflect solar energy passing through the absorber layer back toward the absorber layer. The discontinuous reflector layer may include or consist essentially of aluminum, silver, titanium dioxide, and/or zirconium nitride. Forming the discontinuous back reflector may include or consist essentially of depositing discrete particles of a back-reflector material over the back contact layer, regions between the discrete particles being the discontinuities in the discontinuous back reflector. Forming the discontinuous back reflector may include or consist essentially of disposing a mask over the back contact layer, only portions of the back contact layer being revealed through openings in the mask, and depositing a back-reflector material over the mask to form discrete portions of the back-reflector material through the openings in the mask, regions between the discrete portions being the discontinuities in the discontinuous back reflector. Forming the discontinuous back reflector may include or consist essentially of forming a layer of back-reflector material over the back contact layer, and patterning the layer of back-reflector material to form the discontinuous back reflector and reveal portions of the back contact layer through discontinuities in the discontinuous back reflector. The thin-film absorber layer may make electrical contact with the back contact layer through the discontinuities in the discontinuous back reflector. The third discontinuous passivation layer may be formed after the discontinuous back reflector is formed, and at least some discontinuities in the discontinuous back reflector layer may overlap with discontinuities in the third discontinuous passivation layer.

The discontinuous back reflector and the third discontinuous passivation layer may be formed by a process including or consisting essentially of forming a layer of back-reflector material over the back contact layer, forming a passivation layer over the layer of back-reflector material, and thereafter, patterning the passivation layer and the layer of back-reflector material to form the third discontinuous passivation layer and, thereunder, the discontinuous back reflector, thereby revealing portions of the back contact layer through discontinuities in the third discontinuous passivation layer and discontinuities in the discontinuous back reflector. The thin-film absorber layer may make electrical contact with the back contact layer through discontinuities in the third discontinuous passivation layer and discontinuities in the discontinuous back reflector (which may be substantially aligned with the discontinuities in the third discontinuous passivation layer). A sodium-containing layer may be formed over the back contact layer (e.g., over the third discontinuous passivation layer and over the discontinuous back reflector layer) prior to forming the thin-film absorber layer. The sodium-containing layer may include or consist essentially of NaF and/or Na$_2$Se.

The front contact layer may include or consist essentially of a transparent conductive oxide. The back contact layer may include or consist essentially of molybdenum. The back contact layer may include or consist essentially of a sodium-containing conductive material (e.g., Mo:NaF and/or Mo:Na$_2$MoO$_4$). The absorber layer may include or consist essentially of amorphous silicon, CdTe, chalcopyrite (Cu(In$_x$Ga)(S,Se)$_2$), and/or kesterite (Cu$_2$(Zn,Fe)Sn(S,Se)$_4$). The first, second, and/or third discontinuous passivation layers may include or consist essentially of an insulator having a dielectric constant greater than or approximately equal to 3.9. The first, second, and/or third discontinuous passivation layers may include or consist essentially of an insulator having a dielectric constant greater than or approximately equal to 10. The first, second, and/or third discontinuous passivation layers may have a band gap exceeding 3 eV. The first, second, and/or third discontinuous passivation layers may have a band offset to an adjoining layer (e.g., a layer is direct contact with the passivation layer) exceeding 1 eV. The band offset may be a type-I band offset. The first, second, and/or third discontinuous passivation layers may include or consist essentially of CaO, MgO, and/or ZnS.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6A-6D are schematic plan views of the discontinuous passivation layer and discontinuous reflector layer of FIG. 5A during fabrication thereof in accordance with various embodiments of the invention;

FIGS. 11A-11G are schematic plan views of the structure of FIG. 10 during fabrication thereof in accordance with various embodiments of the invention;

DETAILED DESCRIPTION

Figure 1:
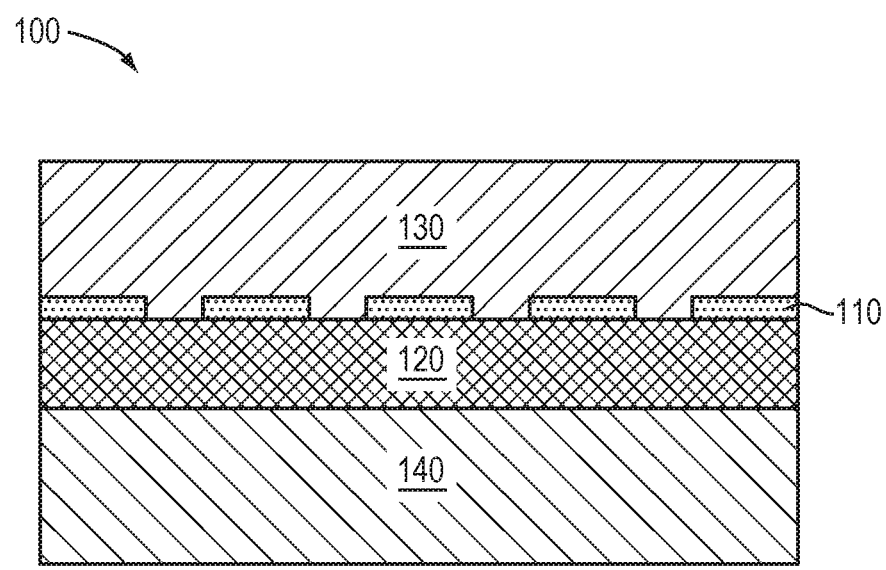
FIG. 1 is a schematic cross-section of a portion of a photovoltaic device incorporating a discontinuous passivation layer in accordance with various embodiments of the invention.

FIG. 1 depicts an exemplary embodiment of the present invention in which a thin-film PV device 100 incorporates a discontinuous passivation layer 110 disposed between a back contact 120 and a thin-film absorber layer 130. The back contact layer 120 may include or consist of, for example, a highly electrically conductive material such as a metal. In some embodiments the back contact layer 120 includes or consists essentially of a refractory metal such as molybdenum (Mo). In some embodiments of the invention, the thin-film PV device 100 also incorporates a sodium-containing layer (as detailed below); in some embodiments, the back contact layer 120 itself contains sodium. For example, the back contact layer 120 may include or consist essentially of Mo:NaF or Mo:Na$_2$MoO$_4$. FIG. 1 depicts an embodiment in which the back contact 120 is disposed on a substrate 140 (e.g., soda lime glass), but "superstrate" embodiments, in which the "substrate" is disposed above the absorber layer 130 (and the remaining layers of the device) are included in the scope of the present invention. Although not depicted in its entirety in FIG. 1, the thin-film PV device 100 itself includes one or more p-n and/or p-i-n junctions (i.e., homojunctions and/or heterojunctions), and is fabricated from a-Si, CdTe, or a chalcopyrite (Cu(In$_x$Ga)(S,Se)$_2$) such as copper indium gallium selenide (CIGS) or a kesterite (Cu$_2$(Zn,Fe)Sn(S,Se)$_4$) such as copper zinc tin sulfide (CZTS). For example, for a PV device 100 in which the absorber layer 130 includes or consists essentially of CIGS, the device 100 may include a junction formed via the incorporation of a CdS layer disposed over the absorber layer 130, as discussed below and as illustrated in subsequent figures. Thus, it is to be understood that the PV devices illustrated herein may only show portions of the device relevant to the particular placement of discontinuous passivation layers in accordance with embodiments of the invention and may therefore incorporate additional layers neither shown nor described.

Figure 2:
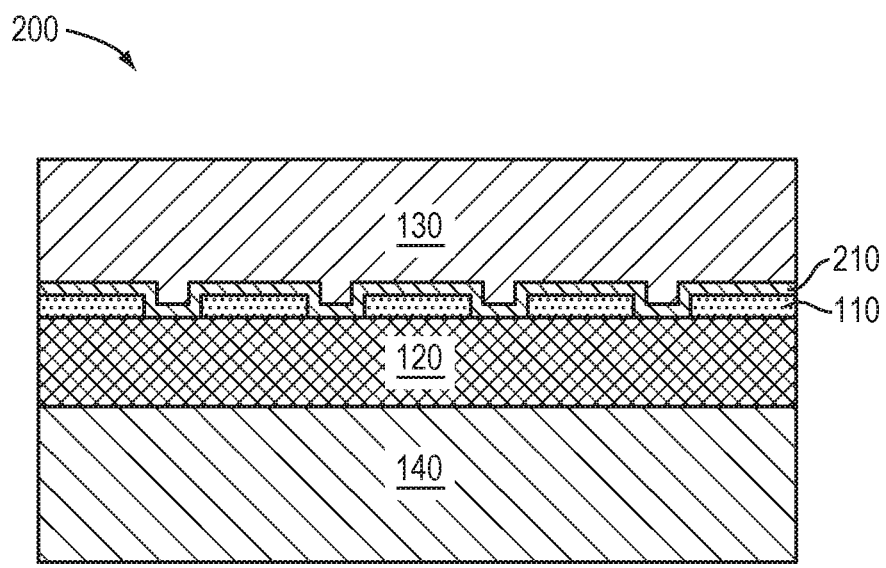
FIG. 2 is a schematic cross-section of a portion of a photovoltaic device incorporating a discontinuous passivation layer and a sodium-containing layer in accordance with various embodiments of the invention.

FIG. 2 depicts a thin-film PV device 200 similar to that depicted in FIG. 1, except for the presence of a sodium-containing layer 210 between the passivation layer 110 and the absorber layer 130. In some embodiments, the presence of a sodium-containing layer 210 (which may include or consist essentially of, e.g., NaF and/or $Na_2Se$) improves the efficiency of the thin-film PV device 200. The sodium-containing layer 210 may supply sodium to the absorber layer 130 during formation thereof; additional sodium may be supplied by the substrate 140—such sodium may diffuse through the back contact layer 120 to the absorber layer 130. Sodium may also be introduced into the PV device 200 in other ways, including as part of the back contact layer 120, or during or after formation of the thin-film absorber layer 130. The sodium-containing layer 210 (and/or other sodium-containing layers described herein) may be continuous (as shown) or discontinuous. Discontinuities in a discontinuous sodium-containing layer 210 may overlap partially or substantially entirely (i.e., be substantially aligned) with discontinuities in a discontinuous passivation layer and/or a discontinuous reflector layer. Alternatively, the discrete regions of a discontinuous sodium-containing layer 210 may partially or substantially entirely overlap the discontinuities in a discontinuous passivation layer and/or a discontinuous reflector layer.

Figure 3A:
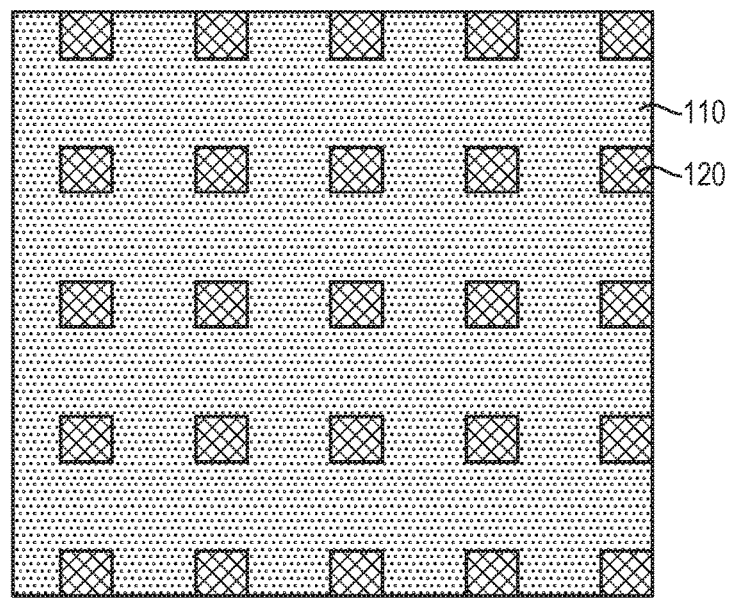
FIG. 3A is a schematic plan view of the discontinuous passivation layer of FIG. 1 in accordance with various embodiments of the invention.
Figures 3B, 3C, 3D:
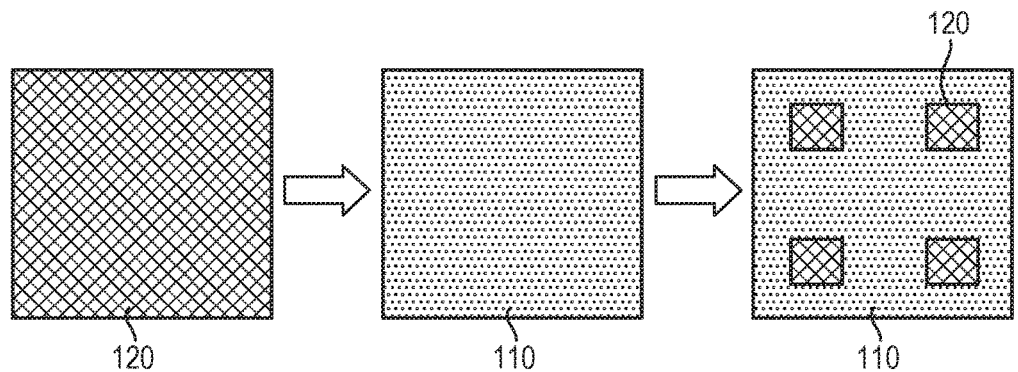
FIGS. 3B-3D are schematic plan views of the structure of FIG. 3A during fabrication thereof in accordance with various embodiments of the invention.
Figure 4:
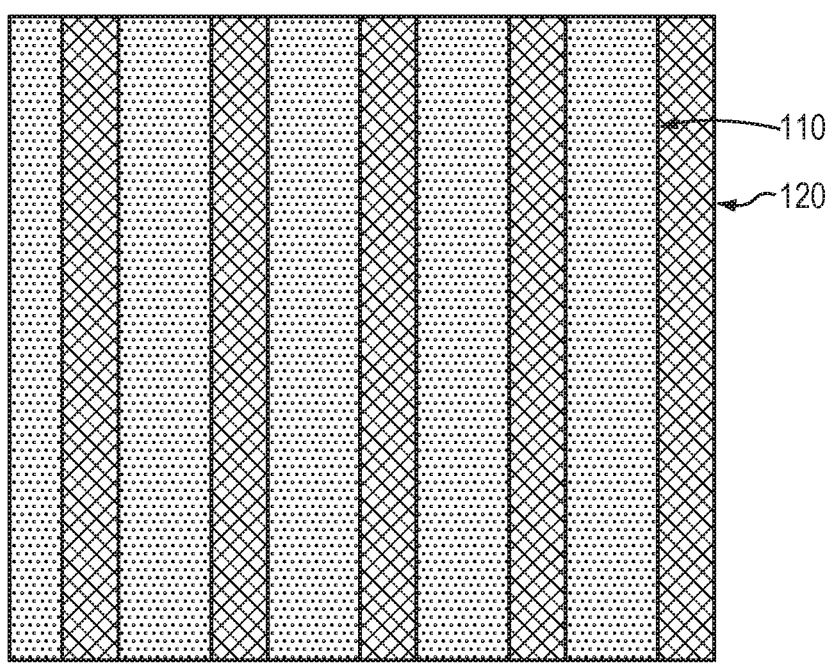
FIG. 4 is a schematic plan view of the discontinuous passivation layer of FIG. 1 in accordance with various other embodiments of the invention.

FIG. 3A depicts a plan view of the discontinuous passivation layer 110 of FIG. 1 after its formation, and FIGS. 3B-3D depict an exemplary process for fabricating the discontinuous passivation layer 110. FIG. 3B depicts the back contact layer 120 (which may itself be formed by, e.g., sputtering upon the substrate 140) prior to the formation of the passivation layer 110. As shown in FIGS. 3C and 3D, the passivation layer 110 may be deposited over the back contact layer 120 as a continuous film (FIG. 3C) and subsequently patterned to form openings that expose portions of the back contact layer 120 (FIG. 3D). The thin-film absorber layer 130 may then be formed over the discontinuous passivation layer 110 and make contact with the exposed portions of the back contact layer 120. In other embodiments, a mask is disposed over the back contact layer 120 such that only portions of the back contact layer 120 are revealed through openings in the mask. The passivation layer 110 may then be deposited over the mask to form discrete portions thereof through the openings in the mask, the regions between the discrete portions being the discontinuities in the passivation layer 110. FIG. 4 is a plan view of another exemplary embodiment of the invention that incorporates a discontinuous passivation layer 110. As shown, the passivation layer 110 has been patterned to form multiple elongated stripes over the back contact layer 120, which is exposed between the passivating stripes. As described above, the absorber layer 130 may be formed over the illustrated structure and make electrical contact with the exposed portions of the back contact layer 120.

Figure 5A:
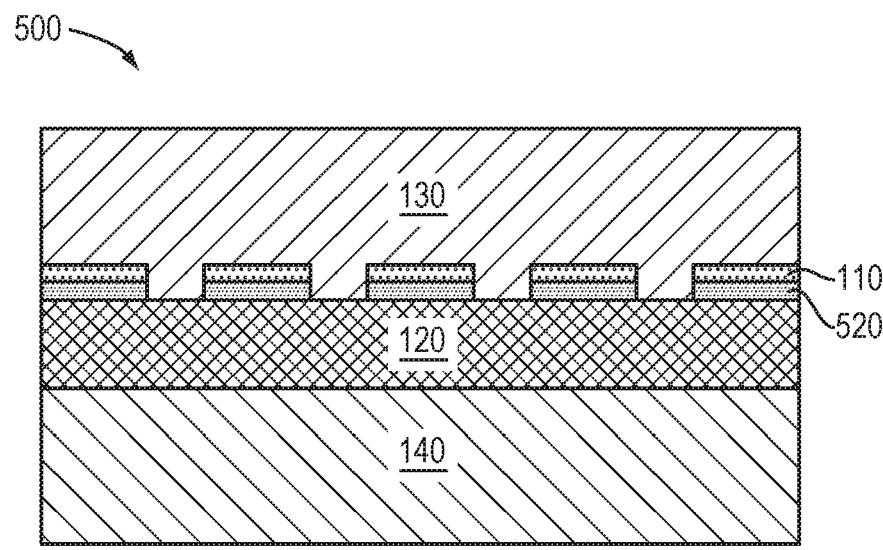
FIG. 5A is a schematic cross-section of a portion of a photovoltaic device incorporating a discontinuous passivation layer and a discontinuous reflector layer in accordance with various embodiments of the invention.
Figure 5B:
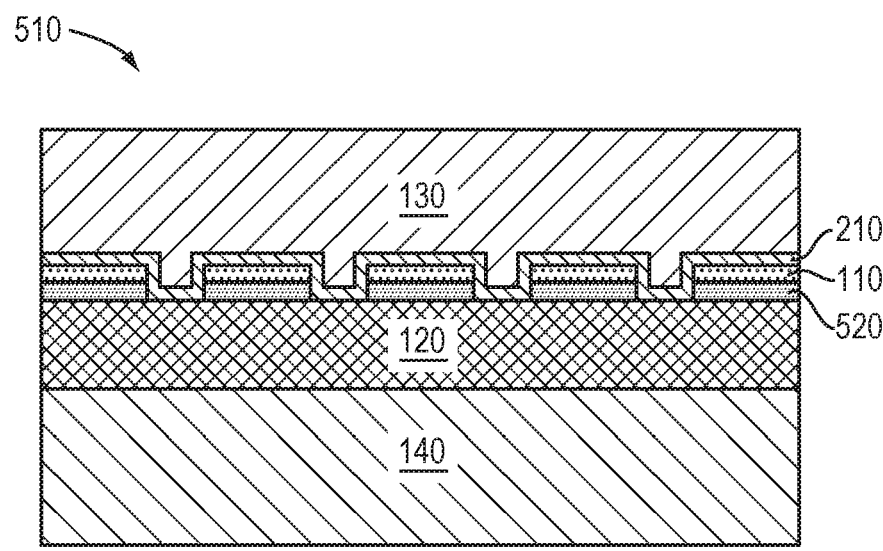
FIG. 5B is a schematic cross-section of a portion of a photovoltaic device incorporating a discontinuous passivation layer, a discontinuous reflector layer, and a sodium-containing layer in accordance with various embodiments of the invention.

FIGS. 5A and 5B depict exemplary thin-film PV devices 500, 510 in accordance with embodiments of the present invention that incorporate a back optical reflector layer 520 between the discontinuous passivation layer 110 and the back contact 120. The back reflector layer 520 may include or consist essentially of a metal (e.g., aluminum) or another material (e.g., $TiO_2$) reflective to solar energy. The back reflector 520 reflects solar energy passing through the absorber layer 130 back to the absorber layer 130, thereby increasing the probability of absorption and the efficiency of the PV device. Materials such as aluminum may not form ohmic contacts with absorber layers including or consisting essentially of CIGS, and thus PV devices 500, 510 each incorporate a discontinuous back reflector layer 520 (e.g., patterned like the passivation layer 110) so that the absorber layer 130 may make electrical contact directly with the back contact layer 120. As shown in FIG. 5B, PV device 510 includes the sodium-containing layer 210 described above while PV device 500 omits this layer.

FIGS. 6A-6D depict portions of an exemplary process, in plan view, for fabricating part of the PV device 500 depicted in FIG. 5A. FIG. 6A depicts the back contact layer 120 (which may itself be formed by, e.g., sputtering upon the substrate 140) prior to the formation of the back reflector layer 520. As shown in FIG. 6B, the back reflector layer 520 may be deposited over the back contact layer 120 either in patterned form (e.g., as a collection of particles or segments) or as a continuous layer that is subsequently patterned to expose portions of the underlying back contact layer 120. The back reflector layer 520 may even be deposited over a mask having openings where the portions of the back reflector layer 520 are desired. The passivation layer 110 may be deposited over the discontinuous back reflector layer 520 (FIG. 6C) and also patterned to reveal the underlying back contact layer 120 (FIG. 6D). (In other embodiments, a mask is disposed over the discontinuous back reflector layer 520 such that all or portions of the discontinuous back reflector layer 520 are revealed through openings in the mask. The passivation layer 110 may then be deposited over the mask to form discrete portions thereof through the openings in the mask, the regions between the discrete portions being the discontinuities in the passivation layer 110.) As shown, at least some of the discontinuities (e.g., holes) in the passivation layer 110 and the back reflector layer 520 overlap, thereby revealing portions of the back reflector layer 120 through both the discontinuous back reflector layer 520 and the discontinuous passivation layer 110. The thin-film absorber layer 130 may then be formed over the discontinuous passivation layer 110 and make electrical contact with the back contact layer 120 through the discontinuities, as shown in FIG. 5A.

Figure 7A:
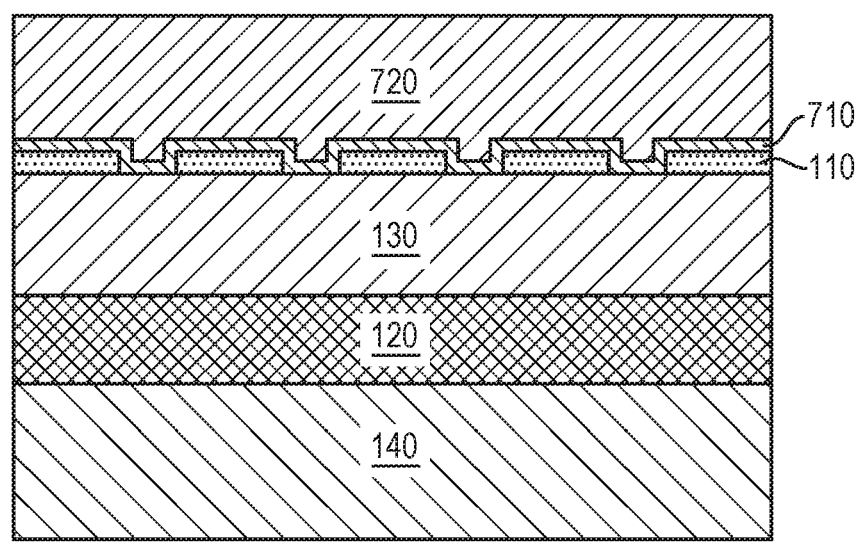
FIGS. 7A and 7B are schematic cross-sections of photovoltaic devices incorporating discontinuous passivation layers in accordance with various embodiments of the invention.
Figure 7B:
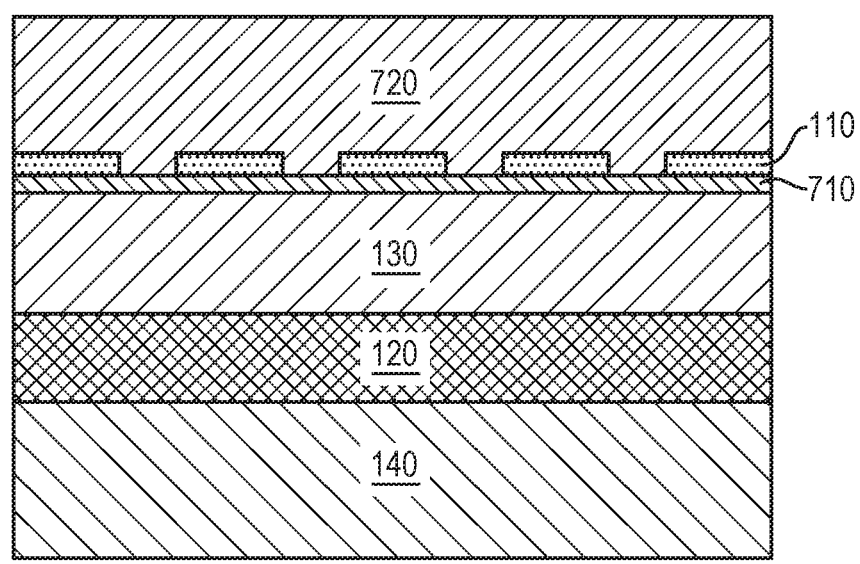

FIG. 7A depicts an exemplary PV device 700 in accordance with various embodiments of the present invention, in which the discontinuous passivation layer 110 is formed between the thin-film absorber layer 130 and a "partner layer" 710 forming the electrical p-n junction with the absorber layer. For example, if the absorber layer 130 exhibits p-type doping, then the partner layer 710 exhibits n-type doping to form the requisite p-n junction. The partner layer 710 may include or consist essentially of the same material as the absorber layer 130 (thereby forming a homojunction) or a different material (thereby forming a heterojunction). FIG. 7A also depicts a front contact layer 720 utilized to contact the top of the thin-film PV device 700. In embodiments in which solar energy illuminates the absorber layer 130 through the front contact layer 720, the front contact layer is preferably at least substantially transparent to solar energy (or one or more portions of the solar spectrum). Thus, the front contact layer 720 may include or consist essentially of, e.g., a transparent conductive oxide such as indium tin oxide or $(B,Al,Ga,In)_2O_3$:ZnO. In some embodiments of the invention, as shown for PV device 730 of FIG. 7B, in order to reduce carrier recombination at the interface between the partner layer 710 and the front contact layer 720, the discontinuous passivation layer 110 is formed between the partner layer 710 and the front contact layer 720.

Figure 8A:
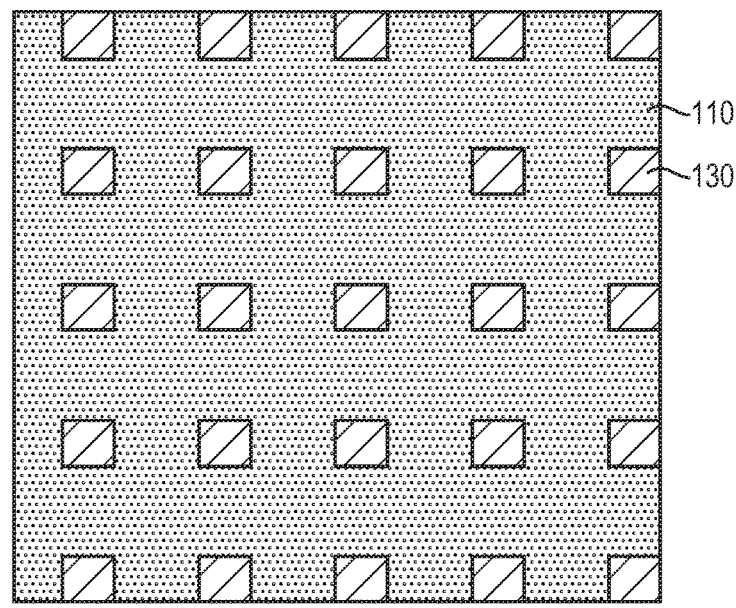
FIG. 8A is a schematic plan view of the discontinuous passivation layer of FIG. 7A in accordance with various embodiments of the invention.
Figures 8B, 8C, 8D:
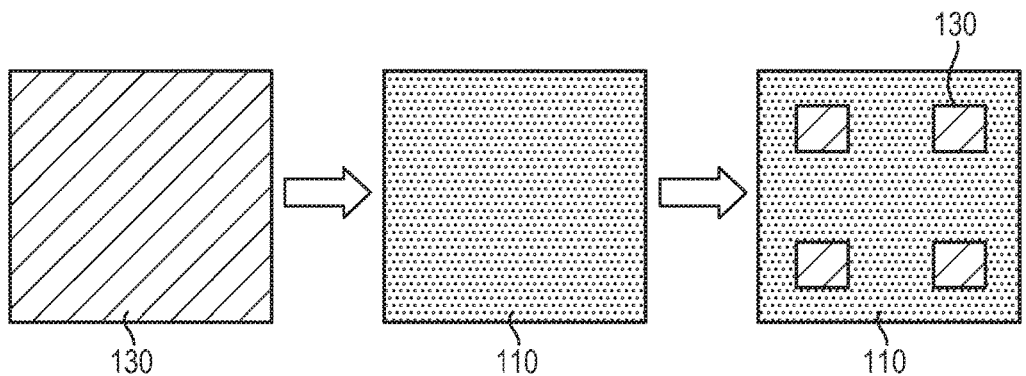
FIGS. 8B-8D are schematic plan views of the structure of FIG. 8A during fabrication thereof in accordance with various embodiments of the invention.
Figure 9:
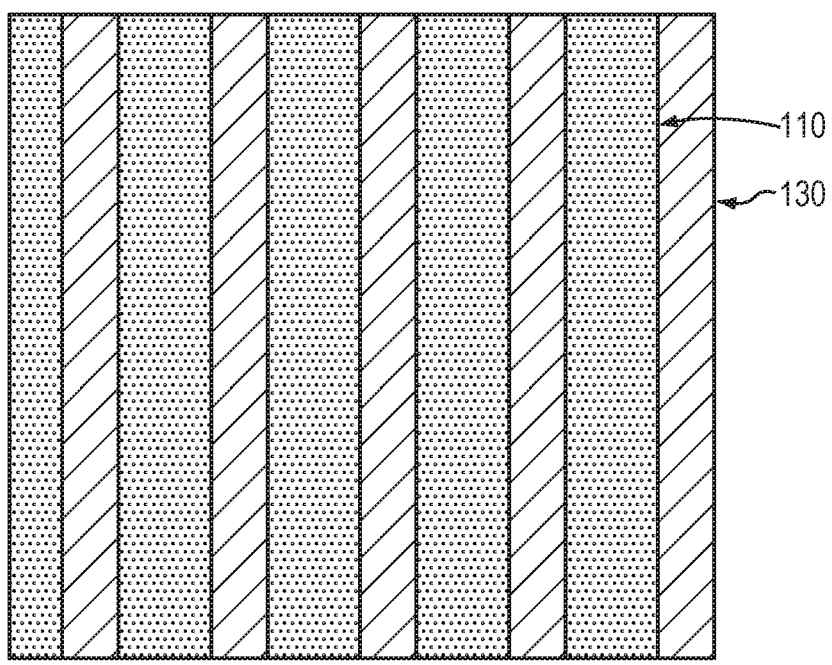
FIG. 9 is a schematic plan view of the discontinuous passivation layer of FIG. 7A in accordance with various other embodiments of the invention.

FIG. 8A depicts a plan view of the discontinuous passivation layer 110 of FIG. 7A after its formation, and FIGS. 8B-8D depict an exemplary process for fabricating the discontinuous passivation layer 110. FIG. 8B depicts the absorber layer 130 prior to the formation of the passivation layer 110. As shown in FIGS. 8C and 8D, the passivation layer 110 may be deposited over the absorber layer 130 as a continuous film (FIG. 8C) and subsequently patterned to form openings that expose portions of the absorber layer 130 (FIG. 8D). The partner layer 710 may then be formed over the discontinuous passivation layer 110 and make contact with the exposed portions of the absorber layer 130, as shown in FIG. 7A. FIG. 9 is a plan view of another exemplary embodiment of the invention that incorporates a discontinuous passivation layer 110. As shown, the passivation layer 110 has been patterned to form multiple elongated stripes over the absorber layer 130, which is exposed between the passivating stripes. As described above, the partner layer 710 may be formed over the illustrated structure and make electrical contact with the exposed portions of the absorber layer 130.

Figure 10:
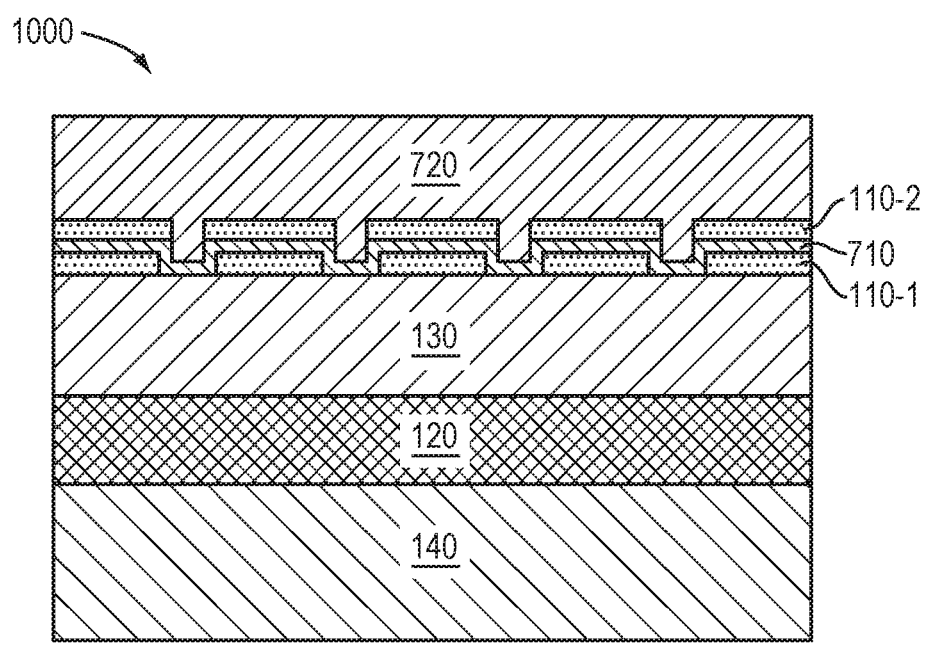
FIG. 10 is a schematic cross-section of a portion of a photovoltaic device incorporating two discontinuous passivation layers in accordance with various embodiments of the invention.

Embodiments of the invention incorporate multiple different discontinuous passivation layers 110 disposed at different locations within the PV device structure. FIG. 10 depicts the cross-section of an exemplary PV device 1000 that incorporates a first discontinuous passivation layer 110-1 between the thin-film absorber layer 130 and the partner layer 710, as well as a second discontinuous passivation layer 110-2 between the partner layer 710 and the front contact layer 720. Although not depicted in FIG. 10, such structures may even include a discontinuous passivation layer (and/or back reflector layer) disposed between the thin-film absorber layer 130 and the back contact layer 120 (as shown in FIGS. 1, 5A, and/or 5B) in addition to the two passivation layers 110-1, 110-2 (or instead of one or the other of them). The patterns of the individual passivation layers 110 need not have the same geometry, feature size, or pitch.

FIGS. 11A-11G depict an exemplary process for fabricating the discontinuous passivation layers 110-1, 110-2 depicted in FIG. 10. FIG. 11A depicts the absorber layer 130 prior to the formation of the first passivation layer 110-1. As shown in FIGS. 11B and 11C, the first passivation layer 110-1 may be deposited over the absorber layer 130 as a continuous film (FIG. 11B) and subsequently patterned to form openings that expose portions of the absorber layer 130 (FIG. 11C). (In other embodiments, a mask is disposed over the absorber layer 130 such that portions of the absorber layer 130 are revealed through openings in the mask. The first passivation layer 110-1 may then be deposited over the mask to form discrete portions thereof through the openings in the mask, the regions between the discrete portions being the discontinuities in the first passivation layer 110-1.) The partner layer 710 may then be formed over the first discontinuous passivation layer 110-1 and make contact with the exposed portions of the absorber layer 130, as shown in FIG. 11D (and FIG. 10). As shown in FIGS. 11E and 11F, the second passivation layer 110-2 may be deposited over the partner layer 710 as a continuous film (FIG. 11E) and subsequently patterned to form openings that expose portions of the partner layer 710 (FIG. 11F). (In other embodiments, a mask is disposed over the partner layer 710 such that all or portions of the partner layer 710 are revealed through openings in the mask. The second passivation layer 110-2 may then be deposited over the mask to form discrete portions thereof through the openings in the mask, the regions between the discrete portions being the discontinuities in the second passivation layer 110-2.) The front contact layer 720 may then be formed over the second discontinuous passivation layer 110-2 and make contact with the exposed portions of the partner layer 710, as shown in FIG. 11G (and FIG. 10). The patterns of the individual passivation layers 110-1, 110-2 need not have the same geometry, feature size, or pitch.

Figure 12A:
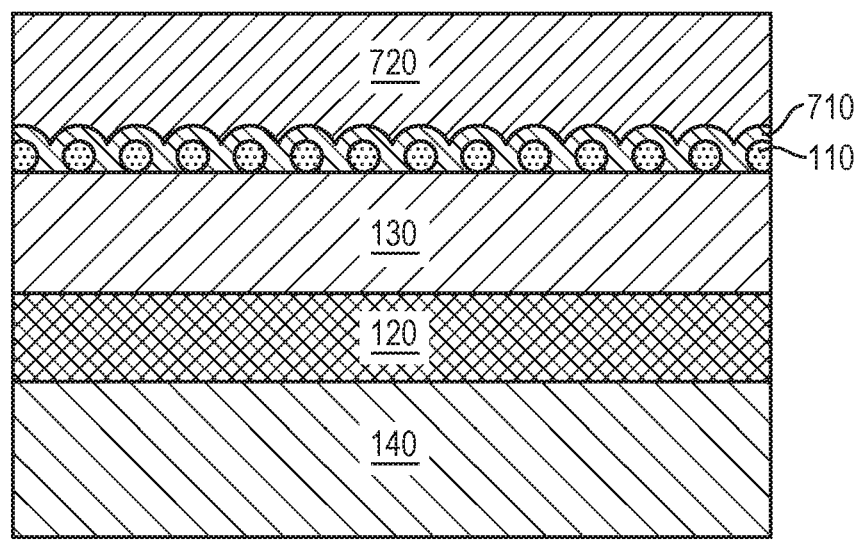
FIG. 12A is a schematic cross-section of a portion of a photovoltaic device incorporating a discontinuous passivation layer in accordance with various embodiments of the invention.
Figure 12B:
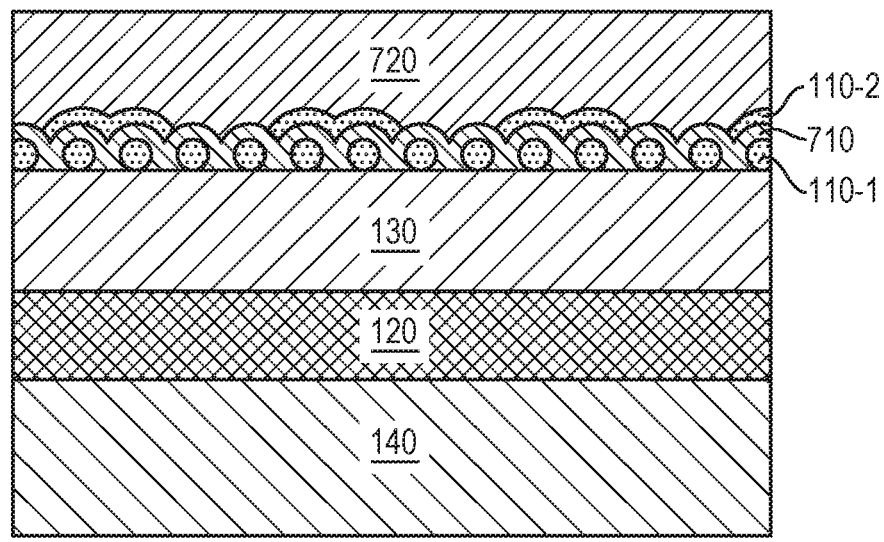
FIG. 12B is a schematic cross-section of a portion of a photovoltaic device incorporating two discontinuous passivation layers in accordance with various embodiments of the invention.

FIGS. 12A and 12B depict exemplary PV devices 1200, 1210 in accordance with embodiments of the present invention in which the discontinuous passivation layer 110 is formed (e.g., deposited) as a collection of particles or other discrete portions, rather than deposited as a uniform layer and subsequently patterned. As shown, in PV device 1200 the passivation layer 110 is deposited as a collection of particles on the thin-film absorber layer 130 and subsequently covered with the partner layer 710, which makes electrical contact with the absorber layer 130 in the regions between the particles (i.e., the "discontinuities" in the discontinuous passivation layer 110). As shown in FIG. 12B, PV device 1210 incorporates a first passivation layer 110-1 similar or identical to the passivation layer 110 in PV device 1200, as well as a second passivation layer 110-2 formed over the partner layer 710 and subsequently patterned prior to formation of the front contact layer 720. In order to form the discontinuous passivation layers 110 in PV devices 1200, 1210 as a collection of discrete portions, the passivation layer material may be deposited over the device structure through a mask having openings where the passivation layer 110 is desired; after formation of the resulting discrete portions, the mask is removed and the additional layers of the PV device structure are formed.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. A photovoltaic device configured for top illumination by solar energy, the photovoltaic device comprising:
 a back contact layer comprising a conductive material;
 a discontinuous back reflector disposed over the back contact layer;
 a thin-film absorber layer disposed over an in electrical contact with the back contact layer, the thin-film absorber layer (i) having a doping polarity and (ii) comprising CdTe, chalcopyrite, or kesterite, wherein (a) the thin-film absorber layer makes direct electrical contact to the back contact layer through discontinuities in the discontinuous back reflector, and (b) the discontinuous back reflector is positioned to reflect solar energy passing through the thin-film absorber layer back through the thin-film absorber layer in a direction away from the back contact layer;

a partner layer disposed over an entirety of the thin-film absorber layer, and being in electrical contact with the thin-film absorber layer, the partner layer having a doping polarity opposite that of the thin-film absorber layer;

a front contact layer disposed over only a top surface of the partner layer and being in electrical contact with the partner layer, the front contact layer comprising a second conductive material; and a discontinuous passivation layer disposed between the partner layer and the front contact layer, the front contact layer making electrical contact with the partner layer only through discontinuities in the discontinuous passivation layer, wherein, between the discontinuities in the discontinuous passivation layer, the front contact layer extends, as a continuous layer, over an entirety of the discontinuous passivation layer.

2. The photovoltaic device of claim 1, wherein the front contact layer comprises a transparent conductive oxide.

3. The photovoltaic device of claim 1, further comprising a substrate disposed below the back contact layer.

4. The photovoltaic device of claim 3, wherein (i) the substrate is transparent and/or (ii) the substrate comprises glass.

5. The photovoltaic device of claim 1, further comprising a superstrate disposed over the front contact layer.

6. The photovoltaic device of claim 5, wherein (i) the superstrate is transparent and/or (ii) the superstrate comprises glass.

7. The photovoltaic device of claim 1, wherein the partner layer and the thin-film absorber layer comprise the same material.

8. The photovoltaic device of claim 1, wherein the discontinuous reflector layer comprises at least one of aluminum, silver, titanium dioxide, or zirconium nitride.

9. The photovoltaic device of claim 1, wherein the back contact layer comprises molybdenum.

10. The photovoltaic device of claim 1, wherein the back contact layer comprises a sodium-containing conductive material.

11. The photovoltaic device of claim 10, wherein the sodium-containing conductive material comprises at least one of Mo:NaF or Mo:Na$_2$MoO$_4$.

12. The photovoltaic device of claim 1, wherein the discontinuous back reflector is metallic.

13. The photovoltaic device of claim 1, wherein the discontinuous back reflector is non-metallic.

14. The photovoltaic device of claim 1, wherein the discontinuous back reflector is in direct mechanical contact with, but does not form an ohmic contact to, the thin-film absorber layer.

15. The photovoltaic device of claim 3, wherein the partner layer is disposed over an entirety of a top surface of the substrate.

16. The photovoltaic device of claim 3, wherein the substrate is not transparent.

17. The photovoltaic device of claim 3, wherein the back contact layer is disposed over an entirety of a top surface of the substrate.

18. The photovoltaic device of claim 5, wherein the partner layer is disposed beneath an entirety of a bottom surface of the superstrate.

19. The photovoltaic device of claim 5, wherein the back contact layer is disposed beneath an entirety of a bottom surface of the superstrate.

20. A photovoltaic device configured for top illumination by solar energy, the photovoltaic device comprising:

a back contact layer comprising a conductive material;

a discontinuous back reflector disposed over the back contact layer;

a thin-film absorber layer disposed over an in electrical contact with the back contact layer, the thin-film absorber layer (i) having a doping polarity and (ii) comprising CdTe, chalcopyrite, or kesterite, wherein (a) the thin-film absorber layer makes direct electrical contact to the back contact layer through discontinuities in the discontinuous back reflector, and (b) the discontinuous back reflector is positioned to reflect solar energy passing through the thin-film absorber layer back through the thin-film absorber layer in a direction away from the back contact layer;

a partner layer disposed over an entirety of the thin-film absorber layer and being in electrical contact with the thin-film absorber layer, the partner layer having a doping polarity opposite that of the thin-film absorber layer;

a front contact layer disposed over and in electrical contact with the partner layer, the front contact layer (i) comprising a second conductive material and (ii) being disposed over only an entirety of a top surface of the partner layer; and a discontinuous passivation layer disposed between the back contact layer and the thin-film absorber layer, the thin-film absorber layer making electrical contact with the back contact layer only through discontinuities in the discontinuous passivation layer.

21. The photovoltaic device of claim 20, wherein the front contact layer comprises a transparent conductive oxide.

22. The photovoltaic device of claim 20, further comprising a substrate disposed below the back contact layer.

23. The photovoltaic device of claim 22, wherein (i) the substrate is transparent and/or (ii) the substrate comprises glass.

24. The photovoltaic device of claim 20, further comprising a superstrate disposed over the front contact layer.

25. The photovoltaic device of claim 24, wherein (i) the superstrate is transparent and/or (ii) the superstrate comprises glass.

26. The photovoltaic device of claim 20, wherein the partner layer and the thin-film absorber layer comprise the same material.

27. The photovoltaic device of claim 20, wherein the discontinuous reflector layer comprises at least one of aluminum, silver, titanium dioxide, or zirconium nitride.

28. The photovoltaic device of claim 20, wherein the back contact layer comprises molybdenum.

29. The photovoltaic device of claim 20, wherein the back contact layer comprises a sodium-containing conductive material.

30. The photovoltaic device of claim 29, wherein the sodium-containing conductive material comprises at least one of Mo:NaF or Mo:Na$_2$MoO$_4$.

31. The photovoltaic device of claim 20, wherein the discontinuous back reflector is metallic.

32. The photovoltaic device of claim 20, wherein the discontinuous back reflector is non-metallic.

33. The photovoltaic device of claim 20, further comprising a sodium-containing layer disposed between the discontinuous passivation layer and the thin-film absorber layer.

34. The photovoltaic device of claim 33, wherein the sodium-containing layer comprises at least one of NaF or Na$_2$Se.

35. The photovoltaic device of claim 20, wherein the discontinuous back reflector is in direct mechanical contact with, but does not form an ohmic contact to, the thin-film absorber layer.

36. The photovoltaic device of claim 22, wherein the partner layer is disposed over an entirety of a top surface of the substrate.

37. The photovoltaic device of claim 22, wherein the substrate is not transparent.

38. The photovoltaic device of claim 22, wherein the back contact layer is disposed over an entirety of a top surface of the substrate.

39. The photovoltaic device of claim 24, wherein the partner layer is disposed beneath an entirety of a bottom surface of the superstrate.

40. The photovoltaic device of claim 24, wherein the back contact layer is disposed beneath an entirety of a bottom surface of the superstrate.

* * * * *